US009106459B2

(12) United States Patent
Koyasu

(10) Patent No.: US 9,106,459 B2
(45) Date of Patent: Aug. 11, 2015

(54) COMMUNICATION CIRCUIT APPARATUS AND TRANSCEIVER HAVING THE SAME

(71) Applicant: DENSO CORPORATION, Kariya, Aichi-pref. (JP)

(72) Inventor: Takahisa Koyasu, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/322,108

(22) Filed: Jul. 2, 2014

(65) Prior Publication Data

US 2015/0035565 A1  Feb. 5, 2015

(30) Foreign Application Priority Data

Aug. 2, 2013 (JP) ................... 2013-161344

(51) Int. Cl.
  *H03K 3/012* (2006.01)
  *H03K 5/24* (2006.01)
  *H04L 25/02* (2006.01)
  *H03K 5/1252* (2006.01)
  *H04L 12/40* (2006.01)

(52) U.S. Cl.
  CPC .......... *H04L 25/0272* (2013.01); *H03K 5/1252* (2013.01); *H03K 5/2418* (2013.01); *H04L 12/40* (2013.01)

(58) Field of Classification Search
  USPC ..................... 327/103, 131–132, 142; 363/73
  See application file for complete search history.

(56) References Cited

U.S. PATENT DOCUMENTS

| 5,994,965 | A | * | 11/1999 | Davis et al. .................... 330/295 |
|---|---|---|---|---|
| 6,070,216 | A | | 5/2000 | Kitakami et al. |
| 8,362,810 | B2 | | 1/2013 | Horn |
| 2005/0243049 | A1 | | 11/2005 | Ueda |
| 2011/0271130 | A1 | | 11/2011 | Neuscheler et al. |
| 2012/0051241 | A1 | | 3/2012 | Mori et al. |

FOREIGN PATENT DOCUMENTS

| JP | 2009-212930 A | 9/2009 |
|---|---|---|
| JP | 2011-044945 A | 3/2011 |

* cited by examiner

*Primary Examiner* — An Luu
(74) *Attorney, Agent, or Firm* — Posz Law Group, PLC

(57) ABSTRACT

A communication circuit apparatus includes: multiple level shift circuits, each of which receives an input signal corresponding to a respective communication bus; an activation comparator for generating an activation signal when the input signal is input into one of the level shift circuits, and a level of the input signal exceeds a predetermined threshold; multiple input current voltage conversion circuits, each of which is arranged together with a respective level shift circuit, converts the input signal to a voltage signal, and outputs the voltage signal as an identification signal; and an identification circuit for identifying one of the communication busses based on the identification signal, which is output from one of the input current voltage conversion circuits. The one of the communication busses corresponds to the one of the level shift circuits, in which the input signal is input.

8 Claims, 8 Drawing Sheets

COMMUNICATION CIRCUIT APPARATUS AND TRANSCEIVER HAVING THE SAME

CROSS REFERENCE TO RELATED APPLICATIONS

This application is based on Japanese Patent Application No. 2013-161344 filed on Aug. 2, 2012, the disclosure of which is incorporated herein by reference.

TECHNICAL FIELD

The present disclosure relates to a communication circuit apparatus and a transceiver having the same.

BACKGROUND

For example, a LIN (local interconnect network) as a multi-communication protocol for a vehicle is used for receiving and transmitting a signal of a sensor, an actuator or the like. In a LIN protocol, a LIN transceiver having one channel and includes one bus activation circuit. On start-up, based on a signal such as an INHIBIT signal, an external circuit is activated. When the number of LIN busses is large, and multiple transceivers are mounted on one ECU (electric control unit), it is necessary for a CPU mounted on the ECU to recognize which transceiver executes an activation of the bus. In this case, the signal such as the INHIBIT signal may be input into a port of the CPU. Alternatively, the signal such as the INHIBIT signal may be transmitted to the CPU as a serial signal. Thus, the recognition in the CPU may be executed in various ways.

When the above constitution is mounted on one ASIC, dark current (i.e., standby current) in a comparator circuit increases. Here, the dark current is consumption electric current or supply current in a sleep mode. Since one comparator circuit as a construction of the receiver executes a function at a standby mode and a function at a communication mode, current always flows in the comparator circuit in order to receive the signal at the standby mode. Thus, when multiple receivers are arranged so as to correspond to multiple channels, the standby current in multiple receivers increases.

(Patent literature No. 1) JP-A-2005-316209

SUMMARY

It is an object of the present disclosure to provide a communication circuit apparatus having multiple receivers with low dark current. It is another object of the present disclosure to provide a transceiver having the communication circuit apparatus.

According to a first aspect of the present disclosure, a communication circuit apparatus includes: a plurality of level shift circuits, each of which receives an input signal corresponding to a respective communication bus; an activation comparator for generating an activation signal when the input signal is input into one of the level shift circuits, and a level of the input signal exceeds a predetermined threshold; a plurality of input current voltage conversion circuits, each of which is arranged together with a respective level shift circuit, converts an input current of the input signal to a voltage signal when the input signal is input into the respective level shift circuit, and outputs the voltage signal as an identification signal; and an identification circuit for identifying one of the communication busses based on the identification signal, which is output from one of the input current voltage conversion circuits. The one of the communication busses corresponds to the one of the level shift circuits, in which the input signal is input.

In the above apparatus, the input signal of the communication bus corresponding to the identification signal is received by functioning a communication comparator according to the activation signal. Until the activation signal is generated, the level shift circuit, the activation comparator and the input current voltage conversion circuit are in a stand-by state capable of receiving the input signal. Thus, the communication comparator can be in the stand-by state without functioning from time when the input signal is received until a communication content of the input signal is received. Thus, the consumption of the dark current is reduced even when the apparatus handles multiple communication busses.

According to a second aspect of the present disclosure, a transceiver includes: a communication circuit apparatus; a plurality of communication comparators; and a plurality of selection circuits. The communication circuit apparatus includes: a plurality of level shift circuits, each of which receives an input signal corresponding to a respective communication bus; an activation comparator for generating an activation signal when the input signal is input into one of the level shift circuits, and a level of the input signal exceeds a predetermined threshold; a plurality of input current voltage conversion circuits, each of which is arranged together with a respective level shift circuit, converts an input current of the input signal to a voltage signal when the input signal is input into the respective level shift circuit, and outputs the voltage signal as an identification signal; an identification circuit for identifying one of the communication busses based on the identification signal, which is output from one of the input current voltage conversion circuits; and an activation timer circuit for executing a timer operation when the activation signal generated by the activation comparator is input into the activation timer circuit and for outputting a delayed activation signal after a predetermined timer period has elapsed. The one of the communication busses corresponds to the one of the level shift circuits, in which the input signal is input. The identification circuit identifies the one of the communication busses in such a manner that the identification circuit outputs the identification signal as a selection signal, which is input from the input current voltage conversion circuit, when the activation timer circuit outputs the delayed activation signal. Each of the communication comparators receives the input signal corresponding to a respective communication bus. The selection circuit selects one of outputs from the communication comparators, which receives the input signal, according to the activation signal and the selection signal.

In the above transceiver, the input signal of the communication bus corresponding to the identification signal is received by functioning a communication comparator according to the activation signal. Until the activation signal is generated, the level shift circuit, the activation comparator and the input current voltage conversion circuit are in a stand-by state capable of receiving the input signal. Thus, the communication comparator can be in the stand-by state without functioning from time when the input signal is received until a communication content of the input signal is received. Thus, the consumption of the dark current is reduced even when the apparatus handles multiple communication busses.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION (First Embodiment)

A communication circuit apparatus for communicating in a vehicle according to a first embodiment will be explained with reference to FIGS. 1 to 5.

Figure 1:
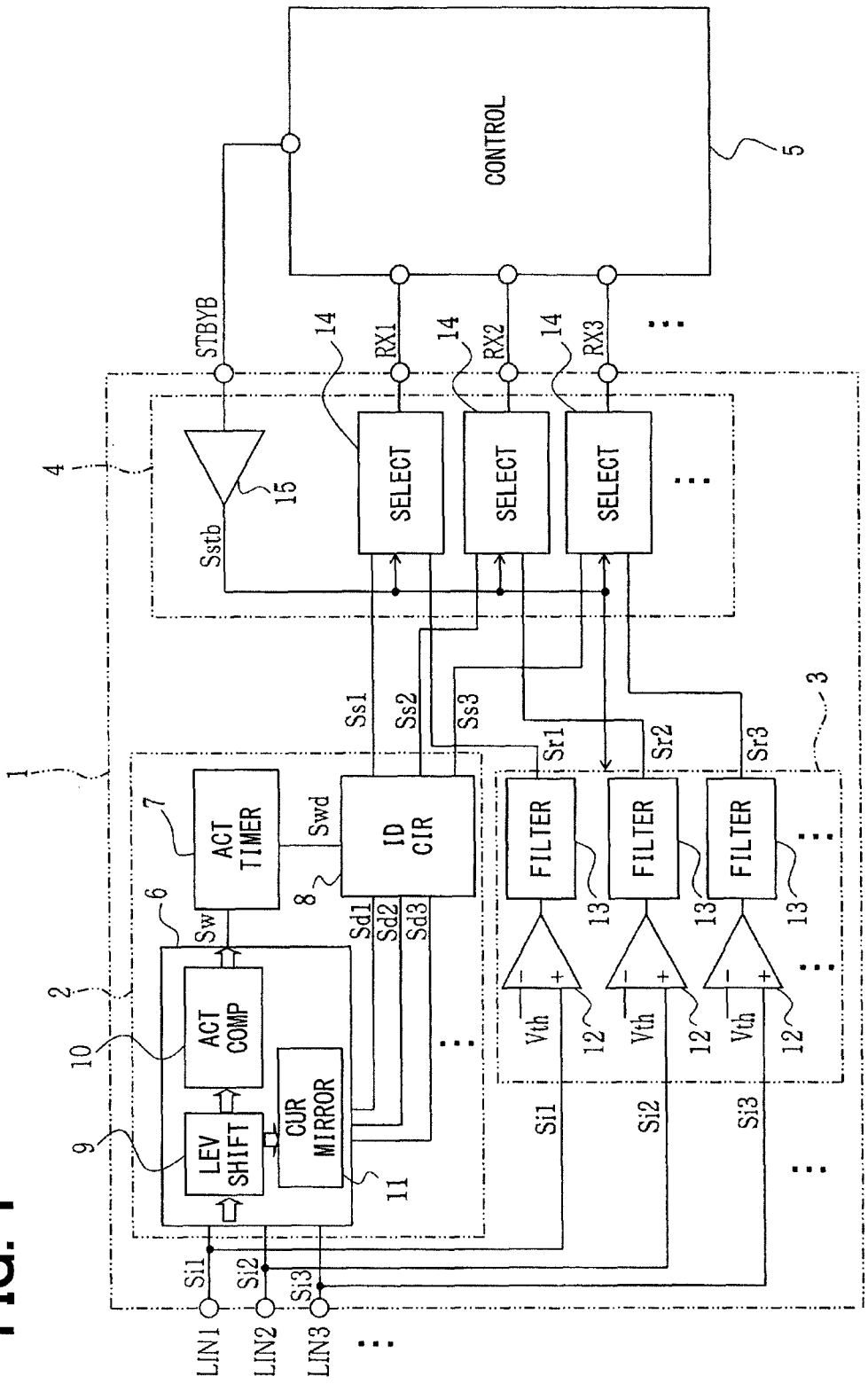
FIG. 1 is a block diagram showing an electric construction of a communication circuit apparatus according to a first embodiment.

In FIG. 1 showing a block diagram of a whole of the apparatus, three LIN busses LIN1-LIN3, which are communication passages, as a communication network arranged in the vehicle are shown. Alternatively, multiple LIN busses LIN1 to LINn as the communication passages may be arranged in the apparatus. Here, the number of LIN busses is equal to or larger than three, and n represents a natural number equal to or larger than three. In the present embodiment, multiple LIN buss communication passages include three communication passages LIN1 to LIN3.

The communication circuit apparatus 1 has a function for providing three transceivers for receiving input signals Si1 to Si3, which are transmitted via three communication passages LIN1 to LIN3. The communication circuit apparatus 1 includes an activation unit 2, a receiving unit 3 and a selection unit 4. A signal received via the activation unit 2, the receiving unit 3 and the selection unit 4 is output to the control circuit 5 as a communication signal. Here, the control circuit 5 includes a microcomputer.

The activation unit 2 includes an activation circuit 6, an activation timer circuit 7 and an identification circuit 8. The activation circuit 6 includes a level shift circuit 9, an activation comparator 10 as an activation comparator circuit, and a current mirror circuit 11 as an input current-voltage converting circuit. The activation circuit 6 controls the level shift circuit 9 to execute the level conversion when at least one of input signals Si1 to Si3 is input from a respective communication passage LIN1 to LIN3. Then, when the level-converted signal exceeds a predetermined level at the activation comparator 10, the level-converted signal is output to the activation timer circuit 7 as an activation signal Sw. Further, the activation circuit 6 sets a signal received by the level shift circuit 9 as an input current, and controls each circuit of the current mirror circuit 11 to convert the input current to a voltage signal. Then, the activation circuit 6 outputs the voltage signal to the identification circuit 8 as an identification signal Sd1 to Sd3.

When the activation signal Sw is input, the activation timer circuit 7 activates the clock circuit mounted therein. Thus, the activation timer circuit 7 functions a counter circuit for counting predetermined time. When the counted time reaches predetermined counted value, the circuit 7 outputs a delay activation signal Swd to the identification circuit 8. When one of the identification signals Sd1-Sd3 is input from the activation circuit 6, the identification circuit 8 outputs a corresponding signal, at time when the delay activation signal Swd input from the activation timer circuit 7 is changed, to the selection unit 4 as a selection signal Ss1 to Ss3.

The receiving unit 3 includes the communication comparator 12 as a communication comparator circuit and the filter circuit 13, which correspond to a respective communication passage LIN1 to LIN3. When the receiving unit 3 obtains a standby signal Sstb from the control circuit 5, the unit 3 is activated, and starts executing a reception function. In the activation state, the communication comparator 12 compares the input signal Si1 to Si3 input from the corresponding communication passage LIN1 to LIN3 with a predetermined threshold voltage Vth, and then, the comparator 12 outputs a reception signal. The filter circuit 13 filters to eliminate a noise from the reception signal, and then, outputs the filtered reception signal to the selection unit 4.

The selection unit 4 includes a selection circuit 14 corresponding to each communication passage LIN1 to LIN3. Further, the unit 4 includes a buffer circuit 15 for amplifying the standby signal Sstb from the control circuit 5. The buffer circuit 15 amplifies the standby signal Sstb input from the control circuit 5, and then, outputs the amplified standby signal to the selection circuit 14 and the receiving unit 3. The selection circuit 14 outputs the signal from the identification circuit 8 to one of terminals RX1 to RX3 when the standby signal Sstb is in a low level. Further, the selection circuit 14 outputs the signal from the receiving unit 3 to the control circuit 5 when the standby signal Sstb having the high level is output from the control circuit side.

Figure 2:
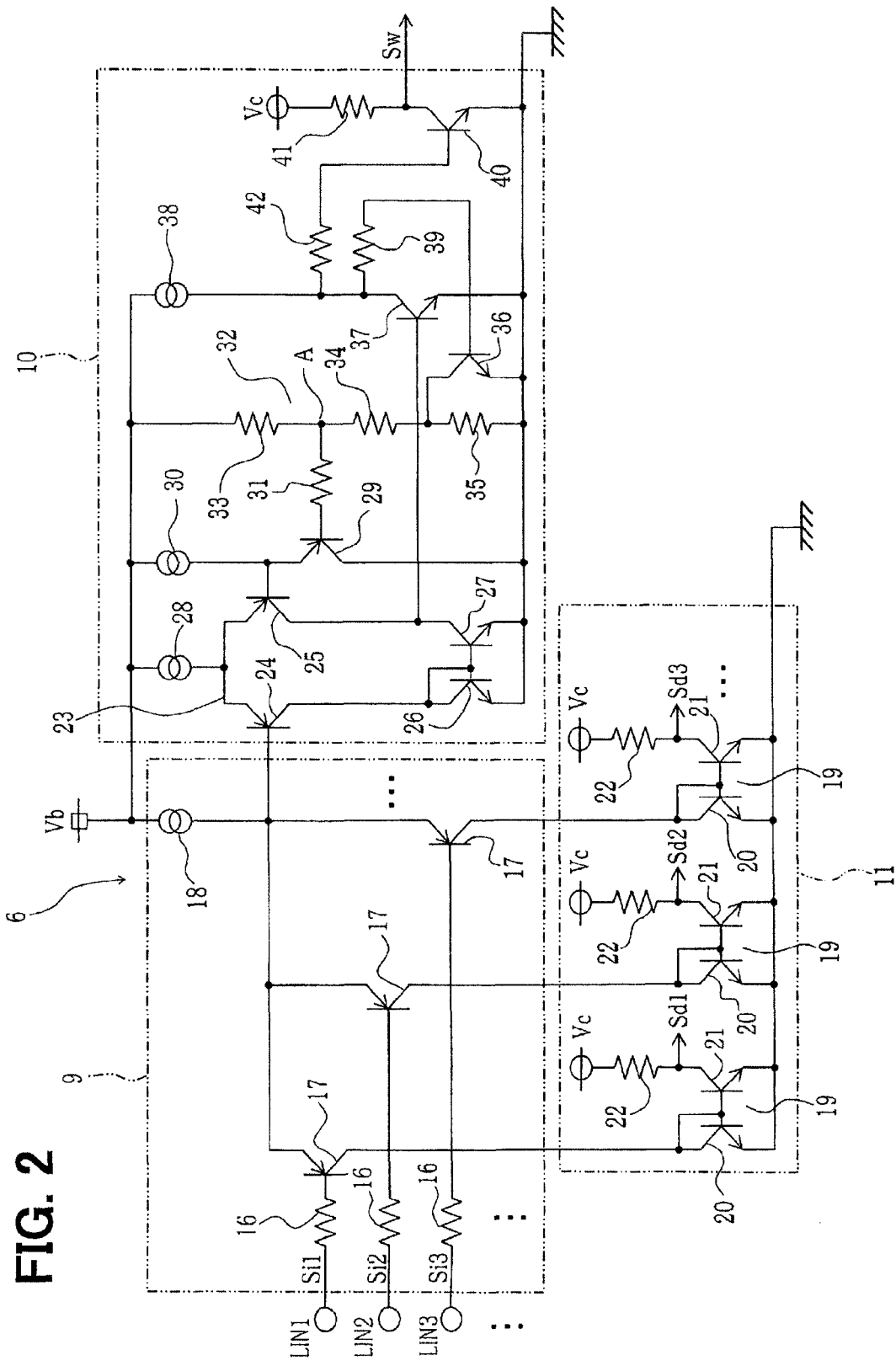
FIG. 2 is a diagram showing an electric construction of an activation circuit.

Next, in FIG. 2 showing the electric construction of the activation circuit 6, the level shift circuit 9 includes a circuit corresponding to each communication passage LIN1 to LIN3. In the level shift circuit 9, an input resistor 16 is coupled with a base of a PNO type transistor 17. An emitter of the transistor 17 is coupled with a power source terminal Vb via a constant current circuit 18. The power source terminal Vb has a power source voltage such as 14 volts.

A collector of each transistor 17 is coupled with a corresponding current mirror circuit 19, which is arranged in the current mirror circuit 11. Each current mirror circuit 19 includes two NPN type transistors 20, 21 and a resistor 22. A collector of the transistor 20 is coupled with a base so that they are short-circuited to each other. A base and an emitter of the transistor 20, 21 are connected commonly. The emitter of the transistor 20, 21 is connected to a ground terminal. A collector of the transistor 21 connected to the power source terminal Vc via the resistor 22. The power source terminal Vc has a power source voltage such as 5 volts. Thus, each current mirror circuit 19 converts the current flowing through the transistor 20 to a voltage signal, so that the circuit 19 outputs the voltage signal from the collector of the transistor 21 as the identification signal Sd1 to Sd3.

In the activation comparator 10, a differential amplifier unit 23 includes two PNP type transistors 24, 25 and two NON type transistors 26, 27. The emitter of the transistor 24 is coupled with the power source terminal Vb via the constant current circuit 28. The collector of the transistor 24 is coupled with the collector and the base of the transistor 26. The emitter of the transistor 25 is coupled with the power source terminal Vb via the constant current circuit 28. The collector of the transistor 25 is coupled with a collector of the transistor 27. The base and the emitter of each of the transistors 26, 27 are commonly coupled with each other. The emitter of each transistor 26, 27 is coupled with the ground terminal.

The base of the transistor 24 as a differential input terminal is commonly connected to the collector of each of three transistors 17 in the level shift circuit 9. The transistor 17 and the transistor 24 provide a Darlington connection. Further, the base of the transistor 25 as the differential input terminal is coupled with the emitter of the PNP type transistor 29. The emitter of the transistor 29 is connected to the power source terminal Vb via the constant current circuit 30. The collector of the transistor 29 is connected to the ground terminal. The base of the transistor 29 is connected to an output terminal A of a standard voltage circuit 32 via the resistor 31.

In the standard voltage circuit 32, resistors 33-35 are arranged as a series circuit between the power source terminal Vb and the ground terminal. A common connection point between the resistors 33, 34 provides an output terminal A. Both ends of the transistor 35 are coupled with the collector and the emitter of the short-circuit transistor 36, respectively. The collector of the NPN type transistor 37 is coupled with the power source terminal Vb via the constant current circuit 38. The emitter of the transistor 37 is coupled with the ground terminal. The base of the transistor 37 is connected to the collector of the transistor 27 in the differential amplifier unit 23. The collector of the transistor 37 is connected to the base of the short-circuit transistor 36 via the resistor 39. The collector of the NPN type transistor 40 as an output terminal is connected to the power source terminal Vc via the resistor 41. The transistor 40 provides an output end. The emitter of the transistor 40 is connected to the ground terminal. The base of the transistor 40 is connected to the collector of the transistor 37 via the resistor 42.

Figure 3:
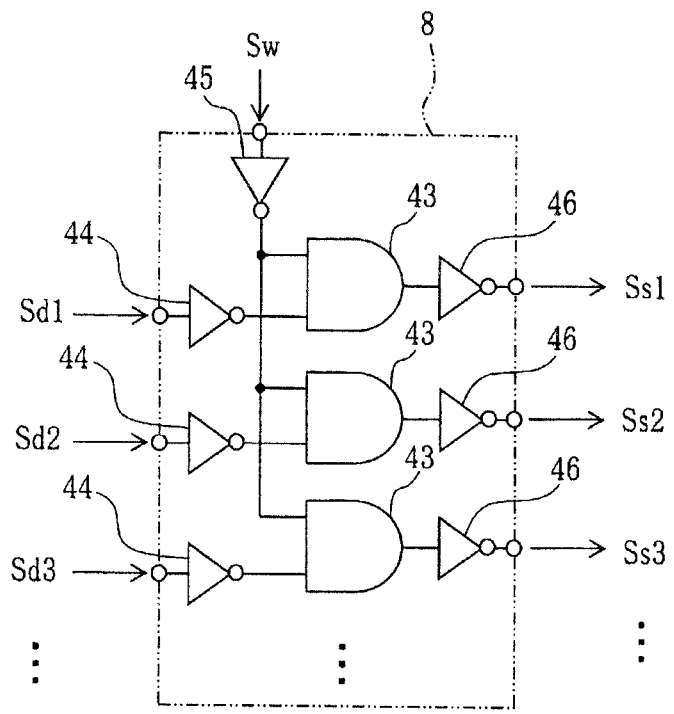
FIG. 3 is a diagram showing an electric construction of an identification circuit.

Next, in FIG. 3 showing the identification circuit 8, the AND circuit 43 is arranged to correspond to each current mirror circuit 19 in the current mirror circuit 11. Each identification signal Sd1-Sd3 is input into a respective AND circuit 43 via the inverter circuit 44. Further, the activation signal Sw is input into another input terminal of the AND circuit 43 via the inverter circuit 45. The output terminal of the AND circuit 43 outputs a respective selection signal Ss1-Ss3 through the inverter circuit 46.

The identification circuit 8 has a logic structure such that the selection signal Ss1-Ss3 as a low active signal is output when an AND condition between the activation signal Sw input as the low active signal and the identification signal Sd1-Sd3 is satisfied. Accordingly, the AND circuit 43 and the inverter circuits 44-46 may be replaced to one OR circuit when the structure functions logically.

Figure 4:
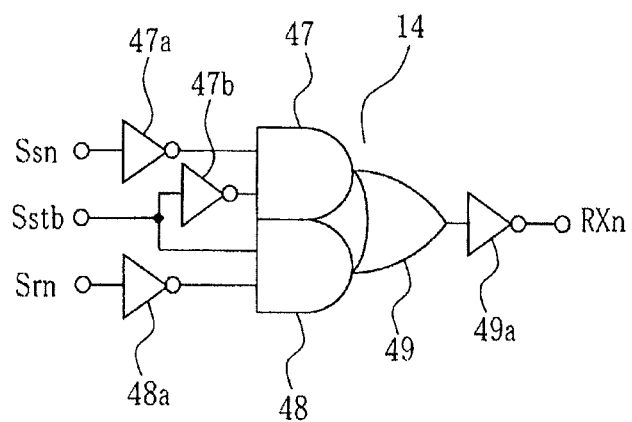
FIG. 4 is a diagram showing an electric construction of a selection circuit.

Next, in FIG. 4 showing the selection circuit 14, a signal prepared by reversing the identification signal Ssn (n=1-3) and the stand-by signal Sstb with the inverter circuit 47a, 47b is input into the AND circuit 47. The stand-by signal Sstb is input into the AND circuit 48, and a signal prepared by reversing the input signal Sin (n=1-3) with the inverter circuit 48a is input into the AND circuit 48. The output signal of each of the AND circuit 47-48 is input into the OR circuit 49. The output of the OR circuit 498 is output as a signal, which is prepared by reversing with the inverter circuit 49a, from the terminal RXn (n=1-3) to the control circuit 5.

Figure 5:
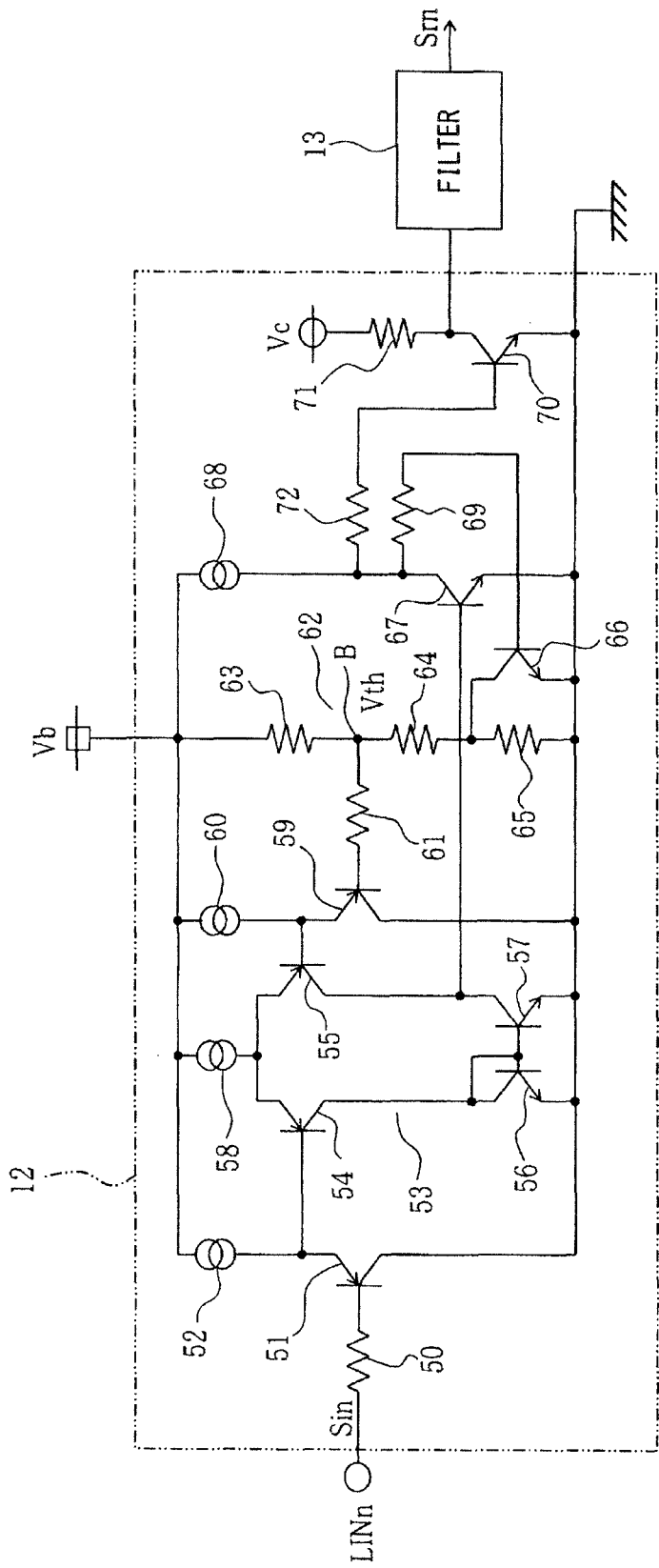
FIG. 5 is a diagram showing an electric construction of a communication comparator.

Next, in FIG. 5 showing the communication comparator 12 corresponding to each communication passage LIN1 to LIN3, the input terminal of the communication passage LIN1 to LIN3 is connected to the base of the PNP type transistor 51 via the input resistor 50. The emitter of the transistor 51 is connected to the power source terminal Vb via the constant current circuit 52. The collector of the transistor 51 is connected to the ground terminal.

The differential amplifier unit 53 includes PNP type transistors 54, 55 and the NPN type transistors 56, 57. The emitter of the transistor 54 is connected to the power source terminal Vb via the constant current circuit 58. The collector of the transistor 54 is connected to the collector and the base of the transistor 56. The emitter of the transistor 55 is connected to the power source terminal Vb via the constant current circuit 58. The collector of the transistor 55 is connected to the collector of the transistor 57. Each of the base and the emitter of the transistors 56, 57 are commonly coupled with each other. The emitter of each transistor 56, 57 is connected to the ground terminal.

The base of the transistor 54 as the differential input terminal is connected to the collector of the transistor 51. The transistors 51, 54 provide a Darlington connection. The base of the transistor 55 as the differential input terminal is connected to the emitter of the PNP type transistor 59. The emitter of the transistor 59 is connected to the power source terminal Vb via the constant current circuit 60. The collector of the transistor 59 is connected to the ground terminal.

The base of the transistor 59 is connected to the output terminal B of the standard voltage circuit 62 via the resistor 61. The standard voltage circuit 62 is arranged between the power source terminal Vb and the ground terminal such that the standard voltage circuit 62 is provided by a series circuit of three resistors 63-65. The common connection point between the resistors 63, 64 provides an output terminal B for setting the threshold voltage Vth. Both ends of the resistor 65 are connected between the collector and the emitter of the transistor 66 for short-circuit. The collector of the NPN type transistor 67 is connected to the power source terminal Vb via the constant current circuit 68. The emitter of the transistor 67 is connected to the ground terminal. The base of the transistor 67 is connected to the collector of the transistor 57 in the differential amplifier unit 53. The collector of the transistor 67 is connected to the base of the transistor 66 for short-circuit via the resistor 69. The collector of the NPN type transistor 70 as the output terminal on the output side is connected to the power source terminal Vb via the resistor 71. The emitter of the transistor 70 is connected to the ground terminal. The base of the transistor 71 is connected to the collector of the transistor 67 via the resistor 72. The collector of the transistor 70 as the output terminal is connected to the filter circuit 13.

Although not shown in the drawings, the communication comparator 12 functioning as a receiver receives the input signal when the stand-by signal Sstb having the high level is input from an external circuit into the comparator 12 so that the comparator 12 switches to an activation state.

Next, the functions of the above described structure will be explained.

The input signal Si3 Si1-Si3 input from one of the communication passages LIN1 to LIN3 is a low active signal. No signal state provides a high level. When a signal exists, the communication signal is transmitted after the low level signal is transmitted.

When no input signal Si1 to Si3 is received from the communication passage LIN1 to LIN3 so that a stand-by state (i.e., a waiting state) is provided, the activation unit 2 and the selection unit 4 in the communication circuit apparatus 1 stand by to be capable of functioning quickly. The receiving unit 3 is in a state of interrupting the function. The control circuit 5 is in a state of outputting the stand-by signal Sstb having the low level to the communication circuit apparatus side. Accordingly, in this case, in the communication circuit apparatus 1, the stand-by current is not generated in each communication comparator 12 of the receiving unit 3. Further, the current is generated in the activation unit 2 since the input signal Si1 to Si3 is input from at least one of the communication passages LIN1 to LIN3 so that the activation comparator 10 is in the stand-by state. However, since the current is generated in one device, the generation of the stand-by current (i.e., the dark current) is restricted.

Next, a case where the input signal Si1 to Si3 is input from one of the communication passages LIN1 to LIN3 will be explained. Specifically, a case where the input signal Si1 is input from the communication passage LIN1 will be explained as an example. The input signal Si1 is input such that the input signal Si1 is divided into the activation unit 2 and the receiving unit 3. Here, in the stand-by state, since the receiving unit 3 stops functioning, the input signal Si1 is not processed at the communication comparator 12.

When the input signal Si1 is input, the input transistor 17 of the level shift circuit 9 in the activation circuit 6 turns on when the low level signal is input into the base of the transistor 17. Thus, the emitter of the input transistor 17 becomes the low level, so that the transistor 17 is energized from the constant current circuit 18 via the power source terminal Vb. Thus, when the low level signal is input into the differential amplifier unit 23, a voltage in the communication comparator 12 is lower than a voltage set by the standard voltage circuit 32. Thus, the comparator 12 outputs the activation signal Sw having the low level as the output signal from the activation circuit 6.

When the current mirror circuit 11 stands by, each input transistor 17 is in the off state, so that the current does not flow in the current mirror circuit 19. Thus, the output at the collector of the transistor 21 is in the high level state, and a voltage of the power source terminal Vb is pull up with the resistor 22. As described above, when the transistor 17 turns on, the current mirror circuit 19 corresponding to the communication passage LIN1 outputs the identification signal Sd1 having the low level under a condition that the current flowing through the transistor 20 is converted to the output voltage at the collector of the transistor 21.

When the activation signal Sw is output from the activation circuit 6, the activation timer circuit 7 starts to execute the predetermined timer function. After a predetermined time such as 70 microseconds has elapsed, the delay activation signal Swd is output to the identification circuit 8. This is because the delay activation signal Swd corresponding to the short input signal Si1 is not output when the short input signal 511 caused by the noise having a signal period shorter than the set time of the timer is input.

When the identification signal Sd1 is input from the activation circuit 6, the identification circuit 8 outputs the selection signal Ss1 at the time when the delay activation signal Swd is input from the activation timer circuit 7. Since the identification signal Sd1 and the delay activation signal Swd are in the low level, the identification circuit 8 inputs the high level signal to the AND circuit 43 via the inverter circuit 44, 45. Since the AND circuit 44 corresponding to the communication passage LIN1 outputs the high level signal, the circuit 44 outputs the selection signal Ss1 having the low level via the inverter circuit 46.

In the selection unit 4, the stand-by signal Sstb having the low level is input into the selection circuit 14 corresponding to the communication passage LIN1 from the control circuit 5 via the buffer circuit 15 as an amplifier. Further, the selection signal Ss1 is input from the identification circuit 8 into the unit 4. Thus, the high level signals are input into the AND circuit 47 corresponding to the communication passage LIN1 via the inverter circuits 47a. 47b, respectively, so that the circuit 47 outputs the high level signal. Further, the stand-by signal Sstb having the low level is input into the AND circuit 48 directly, so that the circuit 48 outputs the low level signal. Accordingly, the OR circuit 49 outputs the high level signal, and the output signal having the low level indicative of the active state is output from the output terminal RX1 via the inverter circuit 49a.

When the control circuit 5 receives the output signal from the output terminal RX1, the control circuit 5 recognizes that the input signal Si1 is received by the communication passage LIN1. Thus, the control circuit 5 outputs the stand-by signal Sstb having the high level. Accordingly, in the communication circuit apparatus 1, the stand-by signals having the high level are input into the receiving unit 3 and the selection circuit 14, respectively. Each communication comparator 12 in the receiving unit 3 is energized so that the comparator 12 is switched to the operation state. Thus, the communication comparator 12 detects the input signal Si1 when the input signal Si1 input from the communication passage LIN1 falls below the threshold voltage Vth. Then, the comparator 12 outputs the reception signal Sr1 having the low level to the selection circuit 14 via the filter circuit 13.

In the selection unit 4, when the stand-by signal Sstb in the selection circuit 14 corresponding to the communication passage LIN1 is changed to the high level, the low level signal is input into the AND circuit 47, so that the AND circuit 47 outputs the low level signal. Further, the AND circuit 48 is in the active state according to the stand-by signal Sstb having the high level. When the reception signal Sr1 having the low level is input into the AND circuit 48 from the receiving unit 3, the high level signal is input into the AND circuit 48 via the inverter circuit 48a. Thus, the AND circuit 48 outputs the high level signal, and the reception signal Sr1 having the low level signal is output from the terminal RX1 via the inverter circuit 49a. After that, when a signal providing to switch the input signal Si1 between the low level and the high level is input, the reception signal Sr1 is output from the output terminal RX1, and then, the reception signal Sr1 is input into the control circuit 5.

After that, the delay activation signal Swd from the activation timer circuit 7 is changed from the low level to the high level, the identification circuit 8 stops outputting the selection signal Ss1 having the low level, so that the selection signal Ss1 becomes the high level. Thus, the selection circuit 14 of the selection unit 4 is changed to a state, in which the output of the reception signal Sr1 from the receiving unit 3 is not selected. Thus, the output of the reception signal Sr1 to the control circuit 5 is stopped.

Further, the control circuit 5 changes the stand-by signal Sstb to be the low level signal. Thus, in the communication circuit apparatus 1, the receiving unit 3 returns to the state of interrupting the operation, and the apparatus 1 is in the stand-by state for waiting for the reception signal from the activation unit 2.

The above operation is performed when the input signal Si1 is input into the communication passage LIN1. Alternatively, even when the input signal Sit, Si3 is input into the communication passage LIN2, LIN3, a corresponding circuit starts to function, so that the control circuit 5 controls the receiving unit 3 to be activated, and the reception signal Sr2, Sr3 is output from the output terminal RX2, RX3.

In the first embodiment, when the input signal Si1 to Si3 is input into the communication passage LIN1 to LIN3 , in the communication circuit apparatus 1, the receiving unit 3 is in the stand-by state under a condition that the unit 3 stops functioning until the activation unit 2 starts to be activated.

Thus, when the unit 3 is in the stand-by state, the communication comparator 12 corresponding to each communication passage LIN1 to LIN3 is not in a state of flowing of the dark current therethrough in order to receive a signal. Thus, the consumption of the dark current is much reduced since the dark current flows in the activation comparator 10 of only one activation unit 2 in the stand-by state of the activation comparator 10, which handles multiple input signals Si1 to Si3.

The apparatus 1 includes the activation timer circuit 7, so that the apparatus 1 outputs the delay activation signal Swd after predetermined timer period has elapsed such as 70 microseconds from the input of the activation signal Sw. Thus, an operation error caused by a noise for a short time input from the communication passage LIN1 to LIN3 is restricted.

It may be considered that the activation comparator is combined with the communication comparator, and a resistor having a high resistance is formed as a semiconductor element in an integrated circuit in order to reduce current in the standard voltage circuit 32, which is always energized. However, in this case, the dimensions such as an area of a device may increase when the pattern of the resistor is lengthened in order to increase the resistance of the resistor in the manufacturing process. On the other hand, in the present embodiment, since the dark current in the stand-by state flows only through one activation comparator 10, it is not necessary to enlarge the dimensions of the apparatus 1, so that the size of the apparatus is minimized in the semiconductor element forming process.

(Second Embodiment)

Figure 6:
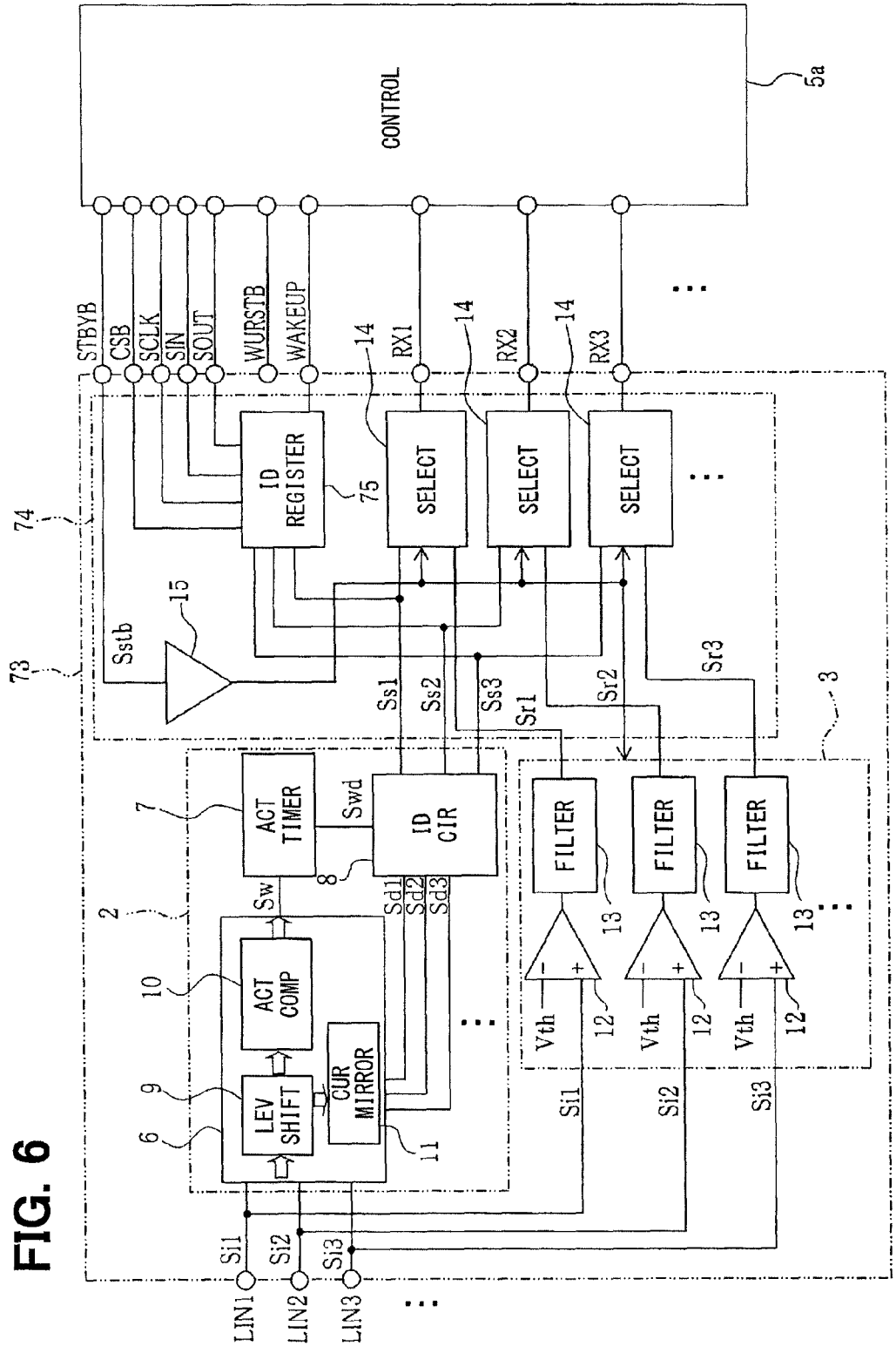
FIG. 6 is a block diagram showing an electric construction of a communication circuit apparatus according to a second embodiment.

FIG. 6 shows a second embodiment, and the different from the first embodiment is a constitution of controlling the communication between the communication circuit apparatus 73 and the control circuit 5a using a SPI (serial peripheral interface) function arranged in the control circuit 5a, which is provided by a microcomputer or the like.

In FIG. 6, the control circuit 5a is provided by the microcomputer, similar to the first embodiment. In the control circuit 5a according to the present embodiment, the stand-by signal Sstb is transmitted to the communication circuit apparatus 73 using the SPI port for the serial communication, which is provided by a conventional microcomputer.

The selection unit 74 of the communication circuit apparatus 73 includes an identification register 75 for the SPI in addition to the selection circuit 14 and the buffer circuit 15 as an amplifier in the selection unit 4. Further, the communication circuit apparatus 73 includes a terminal for the SPI communication to an external device, so that the terminal is coupled with the SPI port of the control circuit 5a. The selection signal Ss1 to Ss3 from the identification circuit 8 is input into the identification register 75. When one of the selection signals Ss1 to Ss3 is input, the identification register 75 executes the serial communication with the control circuit 5a. Thus, the identification register 75 transmits the information to the control circuit 5a, the information from which communication line LIN1 to LIN3 the identification register 75 receives the signal.

When the control circuit 5a receives the information, the control circuit 5a recognizes the communication line LIN1 to LIN3, which transmits the input signal Si1 to Si3 to the control circuit 5a. Further, the control circuit 5a transmits the stand-by signal Sstb having the high level to the reception unit 3 and the selection unit 74 in the communication circuit apparatus 73. The communication circuit apparatus 73 receives the stand-by signal Sstb, so that the reception unit 3 and the selection unit 74 activate, and the apparatus 73 can be a state capable of receiving the input signal Sit to Si3 from the communication passage LIN1 to LIN3. Other functions may be similar to the first embodiment.

Thus, in the second embodiment, after the selection signal Ss1 to Ss3 is received from the communication circuit apparatus 73 using the SPI of the control circuit 5a, the stand-by signal Sstb is transmitted. Thus, the effects similar to the first embodiment are obtained.

(Third Embodiment)

Figure 7:
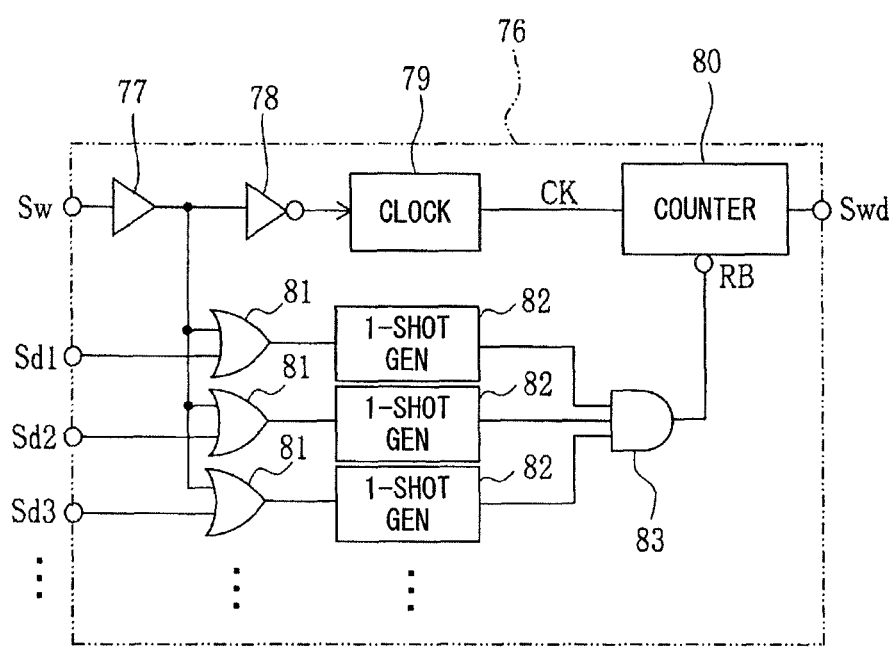
FIG. 7 is a diagram showing an electric construction of an activation timer circuit.
Figure 8:
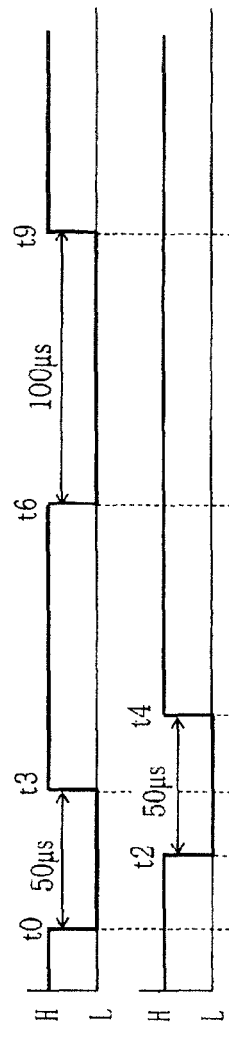
FIGS. 8A to 8I are timing charts showing a signal level at each part.

FIGS. 7 and 8 show a third embodiment. A different from the first embodiment will be mainly explained as follows. In the present embodiment, the apparatus 1 includes the activation timer circuit 76 instead of the activation timer circuit 7. The activation timer circuit 76 prevents the operation error caused by the continuous noise input when the noise is generated in the input signal Si1 to Si3 input from the communication passage LIN1 to LIN3.

Specifically, in the activation timer circuit 76 shown in FIG. 7, the buffer circuit 77, the inverter circuit 78 and the clock circuit 79 are connected to the terminal, in which the activation signal Sw is input from the activation circuit 6. When the activation signal Sw having the low level is input, the high level signal is input into the clock circuit 79 via the buffer circuit 77 and the inverter circuit 78. Thus, the clock circuit 79 is activated so that the circuit 79 outputs the clock signal CK. When the counter circuit 80 receives the clock signal CK from the clock circuit 79, the circuit 80 starts to execute the counting operation. For example, the circuit 80 counts the timer period such as 70 microseconds. Then, the circuit 80 outputs the delay timer signal Swd.

The identification signal Sd1 to Sd3 output from the current mirror circuit 11 of the activation circuit 6 is input into the activation timer circuit 76. The activation timer circuit 76 includes three OR circuits 81 so as to receive the identification signals Sd1 to Sd3, respectively. Further, the activation signal Sw is input into the input terminal of each OR circuit 81 via the buffer circuit 77. The output terminal of each OR circuit 81 is connected to the one-shot generation circuit 82. When the low level signal is input into the one-shot generation circuit 82, the one-shot generation circuit 82 outputs the reset signal having the low level at one-shot. The output terminal of each one-shot generation circuit 82 is connected to the input terminal of the AND circuit, respectively.

The output terminal of the AND circuit 83 is connected to the reset terminal RB of the counter circuit 80. When the reset signal having the low level is input into the counter circuit 80 from the AND circuit 83, the counter circuit 80 reverses the reset signal to the high level, and the counter circuit 80 resets the counting operation. At this time, the counter circuit 80 starts to execute the counting operation after the circuit 80 resets the counting operation when the clock signal CK is input from the clock circuit 79.

Next, the operation of the activation timer circuit 76 will be explained as follows with reference to FIGS. 8A to 8I. In this case, in order to explain the noise removal, the following situation will be assumed. First, the input signal Si1 is input as a noise signal from the communication line LIN1 for a short time such as 50 microseconds. While the input signal Si1 is inputting, the input signal Si2 is input as a noise signal from the communication line LIN2 for a short time such as 50 microseconds. In the above case, in the current mirror circuit 11 of the activation circuit 6, the identification signal Sd1 having the low level is output at time t0. After that, the activation comparator 10 outputs the activation signal Sw having the low level at time t1. These events are shown in FIGS. 8A and 8B. Thus, the OR circuit 81, in which the identification signal Sd1 is input, outputs the low level signal to the one-shot generation circuit 82 when the activation signal Sw is input. The one-shot generation circuit 82 outputs the one-shot pulse signal having the low level. When the AND circuit 83 receives the one-shot pulse signal, the AND circuit 83 outputs the reset signal having the low level to the counter circuit 80.

When the activation signal Sw is output, the clock circuit 79 outputs the clock signal CK. Thus, the clock circuit 79 receives the reset signal from the AND circuit 83, so that the counter circuit 80 starts to execute the counting operation (i.e., the timer function) at time t1, as shown in FIG. 8H.

After that, the counter circuit 80 continues to execute the counting operation, and when the timer period such as 70 microseconds has elapsed, the circuit 80 outputs the delay activation signal Swd. However, the input signal Sit is input as the noise signal from the communication line LIN2 for the short time such as 50 microseconds at time t2 while the identification signal Sd1 having the low level is output. Accordingly, the identification signal Sd2 is input into the activation timer circuit 76 at that time, as shown in FIG. 8B. Thus, similar to the above case, the activation signal Sw is input into the OR circuit 81, in which the identification signal Sd2 is input. As shown in FIG. 8F, the OR circuit 81 outputs the low level signal to the one-shot generation circuit 82. Thus, as shown in FIG. 8G, the one-shot generation circuit 82 outputs the one-shot pulse signal having the low level. When the AND circuit 83 receives the one-shot pulse signal having the low level, the AND circuit 83 outputs the reset signal having the low level to the counter circuit 80. The counter circuit 80 starts to execute the counting operation newly since the reset operation is performed at the circuit 80 while the circuit 80 executes the counting operation, which is triggered by the previous identification signal Sd1, as shown in FIG. 8H.

Thus, the counter circuit 80 starts to execute the counting operation according to the identification signal Sd1 having the short length. The counter circuit 80 starts to newly execute the counting operation according to the identification signal Sd2 having the short length in the middle of the counting operation caused by the identification signal Sd1. Then, at the time t3 after 50 microseconds has elapsed from time t0, the identification signal Sd1 is switched to the high level. Further, the output of the OR circuit 81 corresponding to the identification signal Sd1 is also switched to the high level. In this case, the identification signal Sd2 is still in the low level. However, at the time t4 after 50 microseconds has elapsed from the time t2, the identification signal Sd2 is also switched to the high level.

Thus, the output of the OR circuit 81 corresponding to the identification signal Sd2 is also switched to the high level. Accordingly, the activation signal Sw is switched to the high level at time t5. At the time t5, the clock circuit 79 stops functioning. Further, the counter circuit 80 also stops executing the counting operation. At the time t5, since 70 microseconds has not elapsed from the time t2 when the counter circuit 80 newly starts to execute the counting operation, the counter circuit 80 does not output the delay activation signal Swd.

In this case, the short identification signals Sd1, Sd2 caused by the noise may be input successively, so that the output time of the activation signal Sw is longer than the timer period of the counter circuit 80. However, even when 70 microseconds corresponding to the timer period has elapsed between the time t1 and the time t5, the activation signal Sw provides to reset the counter circuit 80 and to execute the counting operation newly every time the identification signal is input. Thus, the delay activation signal Swd is not output. Thus, the operation error caused by the noise is restricted.

After that, when the proper input signal Si1 is input into the communication line LIN1, and the identification signal Sd1 is input into the activation timer circuit 76 at time t6, the counter circuit 80 starts to execute the counting operation at time t7 when the activation signal Sw is output. The input signal Si1 has a length, which is longer than the timer period, such as 100 microseconds. Thus, after 70 microseconds, i.e., the timer period of the counter circuit 80, has elapsed, and the counting operation is completed at time t8, the delay activation signal Swd is output. Thus, as described in the first embodiment, the signal received by the reception unit 3 is input into the control circuit 5, so that the apparatus executes the communication. Further, the input signal Si1 is switched to the high level, and the identification signal Sd1 is switched to the high level, the delay activation signal Swd is also switched to the high level. Thus, the signal receiving operation is interrupted.

In the third embodiment, when the noise is generated by the input of multiple input signals Si1, Sit, which are overlappingly input for a short time, the activation timer circuit 76 prevents from executing the receiving operation. Thus, the apparatus can execute the communication with restricting the operation error caused by the noise as much as possible.

Here, the counting time (the timer period) of the counter circuit 80 may be different from 70 microseconds. Alternatively, the counting time may be set appropriately so as to remove the nose and execute the communication properly.

(Fourth Embodiment)

Figure 9:
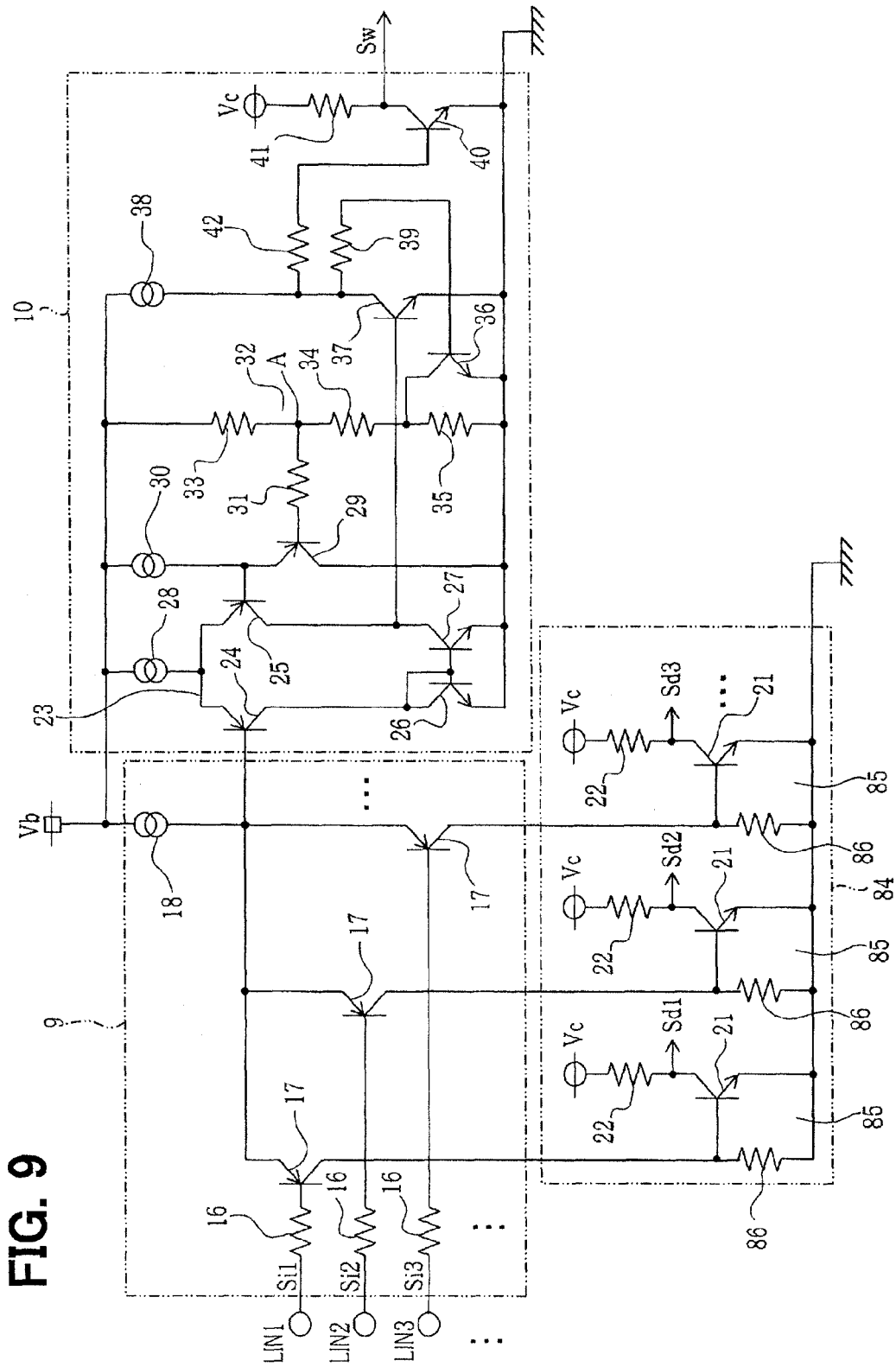
FIG. 9 is a diagram showing an electric construction of an activation circuit according to a fourth embodiment.

FIG. 9 shows a fourth embodiment. The difference from the first embodiment is the input current voltage conversion circuit, which is provided by a device for flowing the current through the resistor so as to convert the current to the voltage signal, instead of the current mirror circuit 11.

Specifically, in the input current voltage conversion circuit 85, the transistor 20 for providing the current mirror circuit 19 is replaced to the resistor 86. Thus, the current flowing through the transistor 17 in the level shift circuit 9 also flows through the resistor 86. The voltage generated between both ends of the resistor 86 is applied to the base and the emitter of the transistor 21. Thus, the transistor 21 turns on. Accordingly, when the transistor 21 is in the off state, the electric potential of the power source terminal Vc, which is connected through the resistor 22, is output as the high level signal. When the transistor 21 turns on, the identification signal Sdn having the low level is output.

Accordingly, in the fourth embodiment, the effects similar to the first embodiment are obtained.

(Other Embodiments)

In the above embodiments, the logic level is set such that the low level provides an active state. Alternatively, the high level may provide an active state.

The active timer circuit 7 may include an element for measuring against noise. Alternatively, if it is not necessary to measure against noise, the activation timer circuit 7 may not include an element for measuring against noise, and the activation signal Sw is used directly.

The third embodiment and/or the fourth embodiment may be combined with the first embodiment. Alternatively, the third embodiment and/or the fourth embodiment may be combined with the second embodiment. Further, the third embodiment may be combined with the fourth embodiment.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A communication circuit apparatus comprising:
a plurality of level shift circuits, each of which receives an input signal corresponding to a respective communication bus;
an activation comparator for generating an activation signal when the input signal is input into one of the level shift circuits, and a level of the input signal exceeds a predetermined threshold;
a plurality of input current voltage conversion circuits, each of which is arranged together with a respective level shift circuit, converts an input current of the input signal to a voltage signal when the input signal is input into the respective level shift circuit, and outputs the voltage signal as an identification signal; and
an identification circuit for identifying one of the communication busses based on the identification signal, which is output from one of the input current voltage conversion circuits,
wherein the one of the communication busses corresponds to the one of the level shift circuits, in which the input signal is input.

2. The communication circuit apparatus according to claim 1, further comprising:
an activation timer circuit for executing a timer operation when the activation signal generated by the activation comparator is input into the activation timer circuit and for outputting a delayed activation signal after a predetermined timer period has elapsed.

3. The communication circuit apparatus according to claim 1,
wherein the input current voltage conversion circuit is a current mirror circuit arranged together with the level shift circuit.

4. The communication circuit apparatus according to claim 1,
wherein the input current voltage conversion circuit converts a level of a voltage at a resistor, which is arranged in an energization passage of the level shift circuit.

5. The communication circuit apparatus according to claim 2,
wherein the identification circuit identifies the one of the communication busses in such a manner that the identification circuit outputs the identification signal as a selection signal, which is input from the input current voltage conversion circuit, when the activation timer circuit outputs the delayed activation signal.

6. The communication circuit apparatus according to claim 2,
wherein the identification signal is input into the activation timer circuit from the input current voltage conversion circuit,
wherein the activation timer circuit executes a new timer operation when a new activation signal is input into the activation timer circuit between start time and output time, and
wherein the activation timer circuit starts to execute the timer operation at the start time, and the activation timer circuit outputs the delayed activation signal at the output time.

7. The communication circuit apparatus according to claim 1,
wherein the level shift circuit includes a plurality of input transistors as an input stage of the activation comparator and a Darlington transistor, and
wherein the input transistors and the Darlington transistor provide a Darlington connection commonly.

8. A transceiver comprising:
a communication circuit apparatus;
a plurality of communication comparators; and
a plurality of selection circuits,
wherein the communication circuit apparatus includes:
a plurality of level shift circuits, each of which receives an input signal corresponding to a respective communication bus;
an activation comparator for generating an activation signal when the input signal is input into one of the level shift circuits, and a level of the input signal exceeds a predetermined threshold;
a plurality of input current voltage conversion circuits, each of which is arranged together with a respective level shift circuit, converts an input current of the input signal to a voltage signal when the input signal is input into the respective level shift circuit, and outputs the voltage signal as an identification signal;
an identification circuit for identifying one of the communication busses based on the identification signal, which is output from one of the input current voltage conversion circuits; and
an activation timer circuit for executing a timer operation when the activation signal generated by the activation comparator is input into the activation timer circuit and for outputting a delayed activation signal after a predetermined timer period has elapsed,
wherein the one of the communication busses corresponds to the one of the level shift circuits, in which the input signal is input,
wherein the identification circuit identifies the one of the communication busses in such a manner that the identification circuit outputs the identification signal as a selection signal, which is input from the input current voltage conversion circuit, when the activation timer circuit outputs the delayed activation signal,
wherein each of the communication comparators receives the input signal corresponding to a respective communication bus, and
wherein the selection circuit selects one of outputs from the communication comparators, which receives the input signal, according to the activation signal and the selection signal.

* * * * *